United States Patent
Yeh

(10) Patent No.: US 9,019,790 B2
(45) Date of Patent: Apr. 28, 2015

(54) APPARATUS AND METHOD FOR REFRESHING DRAM

(75) Inventor: Nan-Hsien Yeh, Hsinchu (TW)

(73) Assignee: Novatek Microelectronics Corp., Hsinchu (TW)

(*) Notice: Subject to any disclaimer, the term of this patent is extended or adjusted under 35 U.S.C. 154(b) by 81 days.

(21) Appl. No.: 13/565,789

(22) Filed: Aug. 2, 2012

(65) Prior Publication Data

US 2013/0033950 A1    Feb. 7, 2013

(30) Foreign Application Priority Data

Aug. 3, 2011    (TW) ............................ 100127565 A

(51) Int. Cl.
G11C 7/00 (2006.01)
G11C 11/406 (2006.01)

(52) U.S. Cl.
CPC ..................... G11C 11/406 (2013.01)

(58) Field of Classification Search
CPC ........... G11C 11/406; G11C 11/40615; G11C 2211/4061
USPC .......... 365/222, 185.25, 189.05, 226, 189.01, 365/185.09; 711/106
See application file for complete search history.

(56) References Cited

U.S. PATENT DOCUMENTS

| | | | |
|---|---|---|---|
| 6,809,979 B1 | 10/2004 | Tang | |
| 7,196,961 B2 * | 3/2007 | Mikami et al. | 365/230.03 |
| 7,447,973 B2 | 11/2008 | Klein | |
| 7,492,658 B2 * | 2/2009 | Oh | |
| 8,164,967 B2 * | 4/2012 | Byom et al. | 365/222 |
| 2006/0268608 A1 * | 11/2006 | Noguchi et al. | 365/185.09 |
| 2008/0239854 A1 * | 10/2008 | Tomita | 365/222 |
| 2010/0106901 A1 * | 4/2010 | Higeta et al. | 711/106 |
| 2012/0075947 A1 * | 3/2012 | Kang et al. | 365/222 |

FOREIGN PATENT DOCUMENTS

| | | |
|---|---|---|
| CN | 101110063 | 1/2008 |
| TW | I271743 | 1/2007 |
| TW | I276102 | 3/2007 |
| TW | 200822112 | 5/2008 |
| TW | 201039345 | 11/2010 |

OTHER PUBLICATIONS

"Notice of Allowance of Taiwan Counterpart Application", issued on Mar. 24, 2014, p. 1-p. 3.
"Office Action of China Counterpart Application", issued on Oct. 23, 2014, p. 1-p. 9.

* cited by examiner

Primary Examiner — Richard Elms
Assistant Examiner — Mohammed A Bashar
(74) Attorney, Agent, or Firm — Jianq Chyun IP Office

(57) ABSTRACT

A refresh method for DRAM is provided, in which a memory cell array is arranged to have multiple storing pages. Each storing page has a counter value. The method includes detecting out a portion of the storing pages being no longer used, indicated as a "no-use portion", and another portion of the storing pages being still in use, indicated as "in-use portion". Then, only the in-use portion of the storing pages is performed with a refreshing operation.

11 Claims, 6 Drawing Sheets

APPARATUS AND METHOD FOR REFRESHING DRAM

CROSS-REFERENCE TO RELATED APPLICATION

This application claims the priority benefit of Taiwan application serial no. 100127565, filed Aug. 3, 2011. The entirety of the above-mentioned patent application is hereby incorporated by reference herein and made a part of this specification.

BACKGROUND OF THE DISCLOSURE

1. Technical Field

The invention relates to a refresh technology for dynamic random access memory, to increase a refreshing operation effect.

2. Background

Dynamic random access memory (DRAM) is already commonly used in different circuit system for digital processing, wherein the most common are, for example, computer systems, to store required temporary information during processing. DRAM and static random access memory (SRAM) are both volatile memory. When a power source is off, the information stored in a memory cell disappears. However, the memory cell structure of DRAM is formed through a MOS transistor and a storage capacitor. Thus, the area occupied on the chip is small, and so it is more commonly used.

FIG. 1 is a schematic view of a conventional DRAM memory cell. Referring to FIG. 1, a DRAM memory cell 50 includes a MOS transistor 52 and a storage capacitor 54. A bit line and a source of the transistor 52 are connected. A drain of the MOS transistor 52 is connected to the storage capacitor 54. The other end of the storage capacitor 54 is connected to the ground. A word line and a gate of the transistor 52 are connected. A word line will connect to multiple memory cells 50, and a bit line will also connect to multiple memory cells. Thus, the memory cells 50 compose a two-dimensional memory cell array. Each memory cell will be accessed by a bit line and a word line that are intersecting.

The transistor 52 is described as an NMOS transistor. For example, when writing a "1" information into the storage capacitor 54, the corresponding connected bit line will exert a 5V voltage signal. At this point the corresponding connected word line will exert a starting voltage, which is, for example also 5V, conducted to the transistor 52. Then the voltage of the bit line will charge the storage capacitor 54 to 5V. After that, the transistor 52 can be turned off by a low voltage state of the bit line. The voltage of the bit line is subsequently turned off, or other memory cells 50 are continued to be written into. In contrast, if a "0" information is written, then the bit line will exert a 0V voltage signal. Thus, the voltage of the storage capacitor 54 is 0V. It can be seen that the information "1" or "0" is stored through the high low voltage of the storage capacitor 54.

The following describes a reading mechanism. FIG. 2 illustrates a conventional reading circuit of a memory cell. Referring to FIG. 2, if the information of the memory cell 50 is to be read, the bit line connected to the memory cell 50 selected to be read is switched to a comparator 56. A reference voltage $V_{Ref}$ of the comparator 56 is between 0V and 5V. When the bit line is conducted through the memory cell 50, the voltage of the bit line is the voltage V of the storage capacitor, which is 0V or 5V. The voltage V of the storage capacitor 54 can be known to be 0V or 5V by comparing the reference voltage $V_{Ref}$.

In the DRAM memory cell 50 structure, if the storage capacitor 54 stores the "1" information with a high voltage level, the electric charge will leak because of leakage current, lowering the voltage. If the voltage value of the storage capacitor 54 is not refreshed after a long time, wrong information will be produced. Generally, to refresh the voltage value of the storage capacitor 54, reading the voltage value of the storage capacitor 54 refreshes it. The reading operation can be an actual obtaining of the information or a dummy read. When rewriting the storage value the information will naturally be refreshed.

FIG. 3A illustrates a conventional diagram of a mechanism of a distributed refresh mode. Referring to FIG. 3A, generally a time interval will require refreshing n times. Conventional refreshing operations can be at a specific time uniformly distributed in a time interval, to perform a refreshing operation towards the memory cell. This is referred to as a distributed refresh mode. Another refreshing operation is, for example, a burst refresh mode. A pulse represents one refreshing operation. FIG. 3B illustrates a conventional diagram of a mechanism of a burst refresh mode. Referring to FIG. 3B, the burst refresh mode will continuously perform multiple refreshing operations in a time interval.

SUMMARY OF THE INVENTION

The invention provides a lesser burden on the refreshing operation of DRAM, to improve the utilization effectiveness of DRAM.

The invention provides a refresh method for DRAM, wherein a memory cell array is arranged to have multiple storing pages, and each storing page has a counter value. The method includes detecting a portion of the storing pages no longer being used, indicated as a "no-use portion", and only performing the refreshing operation towards another portion of the storing pages still being in use, indicated as an "in-use portion".

The invention provides a refresh device for DRAM, wherein a memory cell array is arranged to have multiple storing pages, and each storing page has a counting down counter value. The refresh device includes an access control unit, a memory controller, a refresh control unit, and a monitoring unit. The memory controller accesses a frame data through the access control unit, wherein the frame data is accessed in a portion of the storing pages. The refresh control unit performs a refresh operation towards the storage pages according to a designated address. The monitoring unit detects the no-use portion, and notifies the refresh control unit to only perform the refreshing operation towards another portion of the storing pages still being in use, the in-use portion.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

When considering conventional refresh methods, regardless the type of refresh mode, a conventional refresh method will perform a refreshing operation towards the memory cells of the entire DRAM. A few of the memory cells store data that will not be used anymore. However, those memory cells are still refreshed, effectively taking up operating time for normal reading, causing the refreshing operation to be unnecessarily burdened.

The invention provides a refresh method for DRAM memory cells that lessen the burden on the refreshing operation of DRAM, to improve the utilization effectiveness of DRAM. Embodiments are described hereinafter to clarify the invention. However, the invention is not limited to the embodiments.

Figure 1:
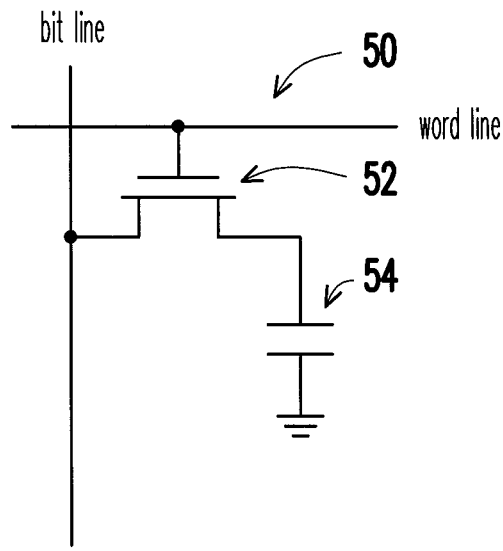
FIG. 1 is a schematic view of a conventional DRAM memory cell.
Figure 2:
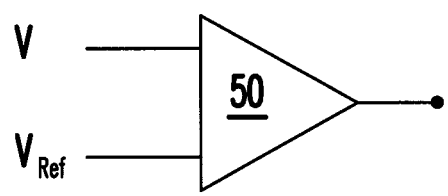
FIG. 2 illustrates a conventional reading circuit of a memory cell.
Figure 3A:
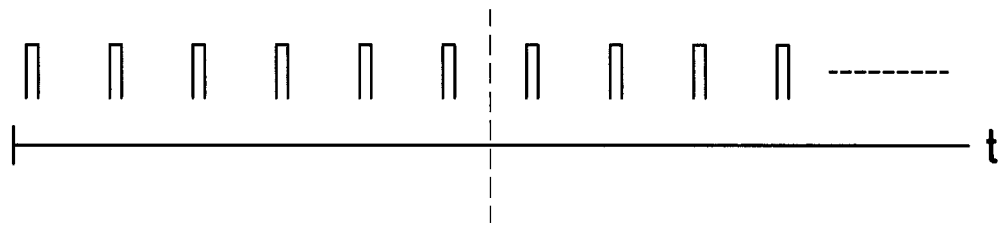
FIG. 3A illustrates a conventional diagram of a mechanism of a distributed refresh mode.
Figure 3B:
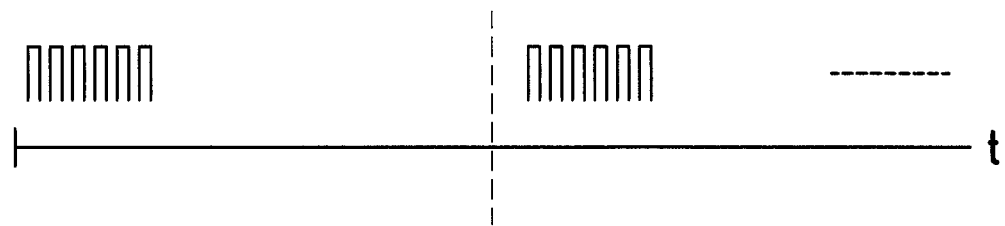
FIG. 3B illustrates a conventional diagram of a mechanism of a burst refresh mode.
Figure 4:
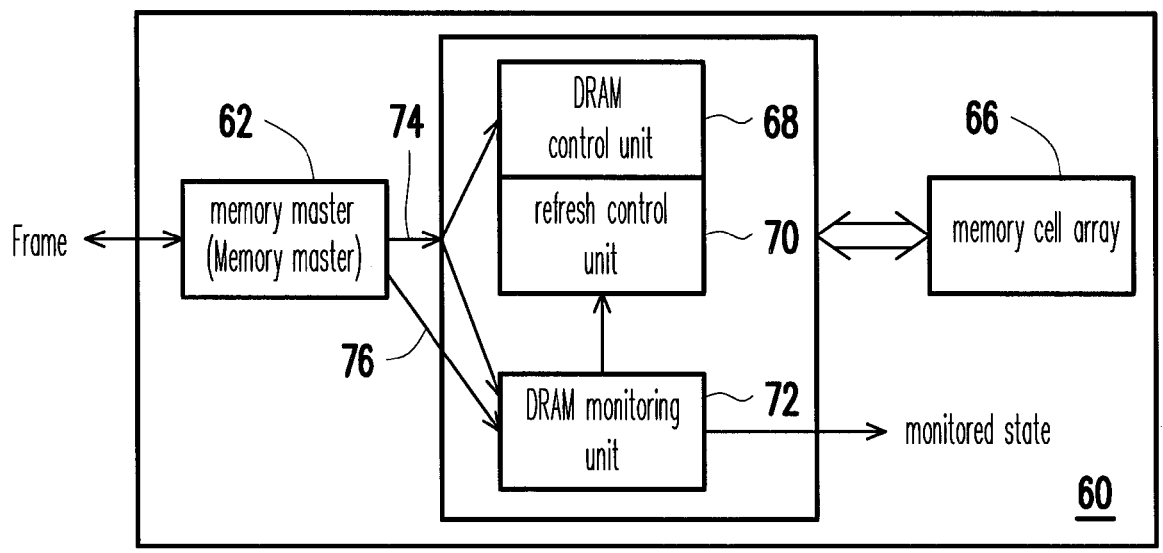
FIG. 4 is a schematic diagram of a circuit structure of a refresh device for DRAM according to an embodiment for the invention.
Figure 6:
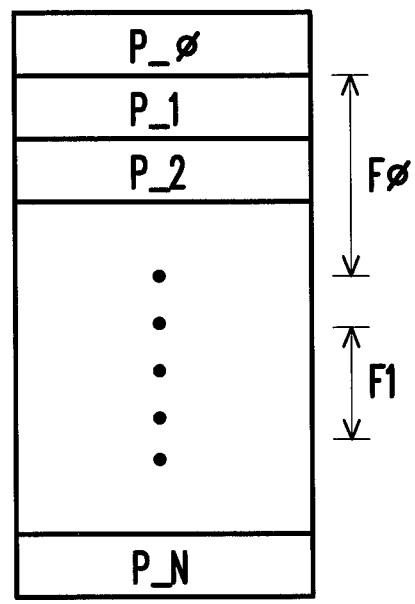
FIG. 6 is a corresponding schematic diagram between frame data and storing pages according to an embodiment of the invention.

FIG. 4 is a schematic diagram of a circuit structure of a refresh device for DRAM according to an embodiment for the invention. Referring to FIG. 4, regarding a memory system 60, the memory system 60 includes a memory master 62, a DRAM control unit 68, a refresh control unit 70, a monitoring unit 72, and a memory cell array 66. The DRAM control unit 68, the refresh control unit 70, and the monitoring unit 72 are in an access controller 64. The memory cell array 66 is arranged to have multiple storing pages, which is shown in FIG. 6. The DRAM control unit 68 is used to control the access towards the memory cell array 66. The memory master 62 will transmit a read/write instruction 74 to the DRAM control unit 68 to access the memory cell array 66 frame data according to writing in or reading out the frame data by an external request. The read/write instruction 74 will be monitored by the monitoring unit 72, to determine the effectiveness of the frame data, and decide which data of the storing pages in the memory cell array 66 are no longer used. Thus, the refresh control unit 70 is notified to only perform the refreshing operation towards the storing pages that are still in use.

Accordingly, to determine whether the storing pages are still in use or not in use, besides using the read/write state of the frame data as a basis, a side information provided by the memory master 62 to each frame data can be used to assist in determining the usage state of the detected storing pages.

Figure 5:
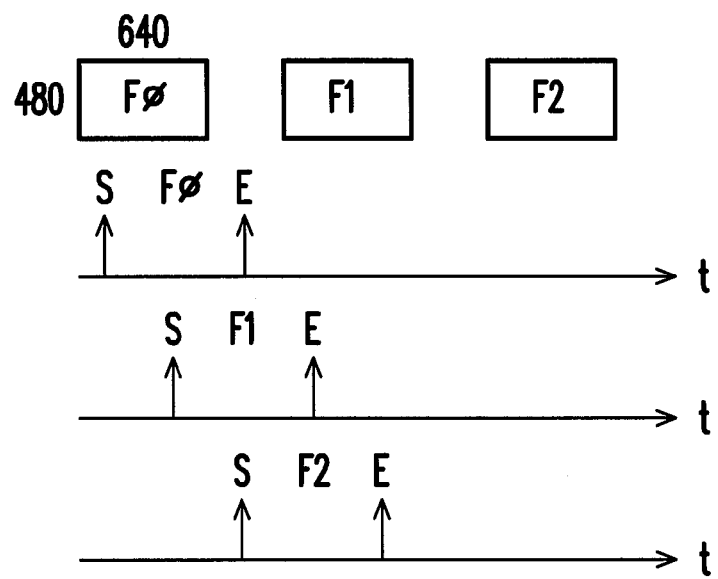
FIG. 5 is schematic diagram showing the relationship between a frame and a side information according to an embodiment of the invention.

The utilization mechanism of the side information is further described below. FIG. 5 is schematic diagram showing the relationship between a frame and a side information according to an embodiment of the invention. Referring to FIG. 5, a frame data is, for example, a 480×640 image data. The memory cell array 66 can store multiple frames at the same time, wherein F0, F1, F2 . . . are used to represent the frame sequence.

The side information of the frame F0, for example, includes a start time represented by S, and an end time represented by E. The start time S means that there will be no effective data of the frame F0 until after that time. The end time E means that the effective data of the frame F0 will not be used after that time. Similarly, each frame will be identified due to an external operation and the side information 76 is provided by the memory master 62 to the monitoring unit 72. In addition, the read/write instruction 74 transmitted by the memory master 62 can obtain the address of the storing page used by the frame.

The content of the side information 76 is used to assist in determining the usage state of the detected storing pages. That is to say, the content of the side information 76 can have other content, and is not limited to the embodiment.

FIG. 6 is a corresponding schematic diagram between frame data and storing pages according to an embodiment of the invention. Referring to FIG. 6, the memory cell array 66 is, for example, arranged to have N storing pages, represented by P_0 to P_N−1. The frames F0, F1 . . . be written into corresponding storing pages. Even though the figures show the stored frame data are stored by continuous storing pages, this is not the only method. A common writing method may be used for storing.

Figure 7:
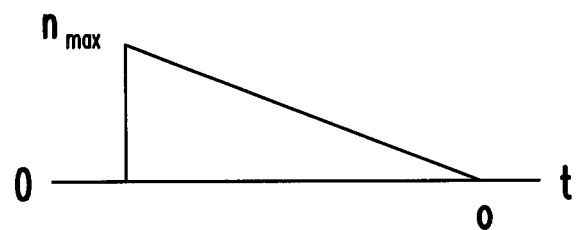
FIG. 7 is a characteristic schematic view of a counting down counter according to an embodiment of the invention.

Accordingly, a counter is disposed in each corresponding storing page of the refresh control unit 70 or the monitoring unit 72. A counting up or a counting down method reflects the time the storing page has not yet been refreshed. FIG. 7 is a characteristic schematic view of a counting down counter according to an embodiment of the invention. Referring to FIG. 7, the counter of the embodiment is described as a counting down counter. The counting down counter corresponding to each storing page will have a maximum value $n_{max}$ at the beginning or the end of refreshing. The counting down counter will subtract 1 from the maximum value $n_{max}$ along a specific time interval, for example, $n_{max}-1$, $n_{max}-2$ . . . , until the value is 0.

However, if the storing page is refreshed, the counting down counter value returns to $n_{max}$. Thus, the counting down counter value can reflect how long since the storing page has been refreshed. If it is too long, wrong information may be produced because the storage capacitor of the memory cell changes the storage value from current leakage.

Thus, if the counting down counter value of a storing page is lower than a critical value, and the data stored in the storing page is still being used, then that storing page requires a refreshing operation.

Another way to determine if the data of the storing page is used is to directly analyze and determine according to the reading frequency of the data, without referring to side information. This method is, for example, the method described below.

Figure 8:
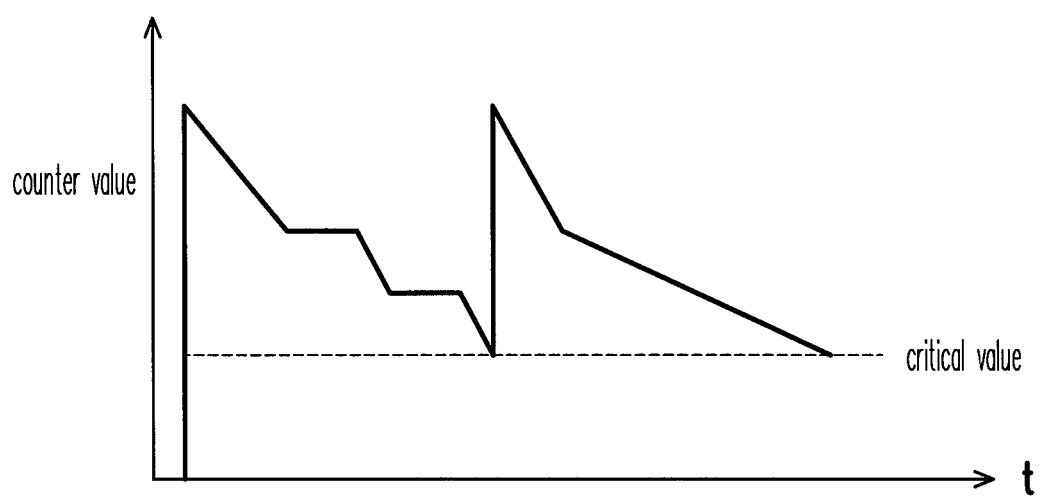
FIG. 8 is a characteristic schematic view of a counting down counter according to an embodiment of the invention.

FIG. 8 is a characteristic schematic view of a counting down counter according to an embodiment of the invention. Referring to FIG. 8, using the counting down counter as an example, if the data is read or refreshed, the counter value will be reset to the maximum value. One example is, when the counter value is reduced to be lower than a critical value, the refresh operation will be started, which causes the counter value to be reset as the maximum value. Through this characteristic, the usage condition of the data can be determined by directly detecting the counter value.

After the data of the storing page is written, if it continues to be frequently read in short time intervals by a connected external device, each time the data is read, the data of the storing pages will be refreshed. Thus, the counting down counter value will maintain at a value higher than the critical value. The critical value is set at a small value or at 0. If the storing page is rewritten with data, then it will naturally be that situation that the new frame data is written in.

However, if the frame data is not in use, then the storing pages that are used will not be refreshed. Thus, after a period of time, the counting down counter value will become lower than a critical value or arrive at 0. This means the frame data may, possibly, not be used anymore, and the storing page with a counting down counter value lower than a critical value will be determined as not in use. Thus, a refreshing operation need not be particularly performed for the at least one storing page used by the frame.

However, if and when the counting down counter value of the storing page is less than a critical value or arrives at 0, and the storing page is read, a warning message warns that the data may be wrong is transmitted. In addition, if the storing pages are written into, this represents new data, and the old data will no longer be saved. Thus, the usage condition of the storing page can be determined through the reading frequency of the data, without the assistance of side information.

Figure 9:
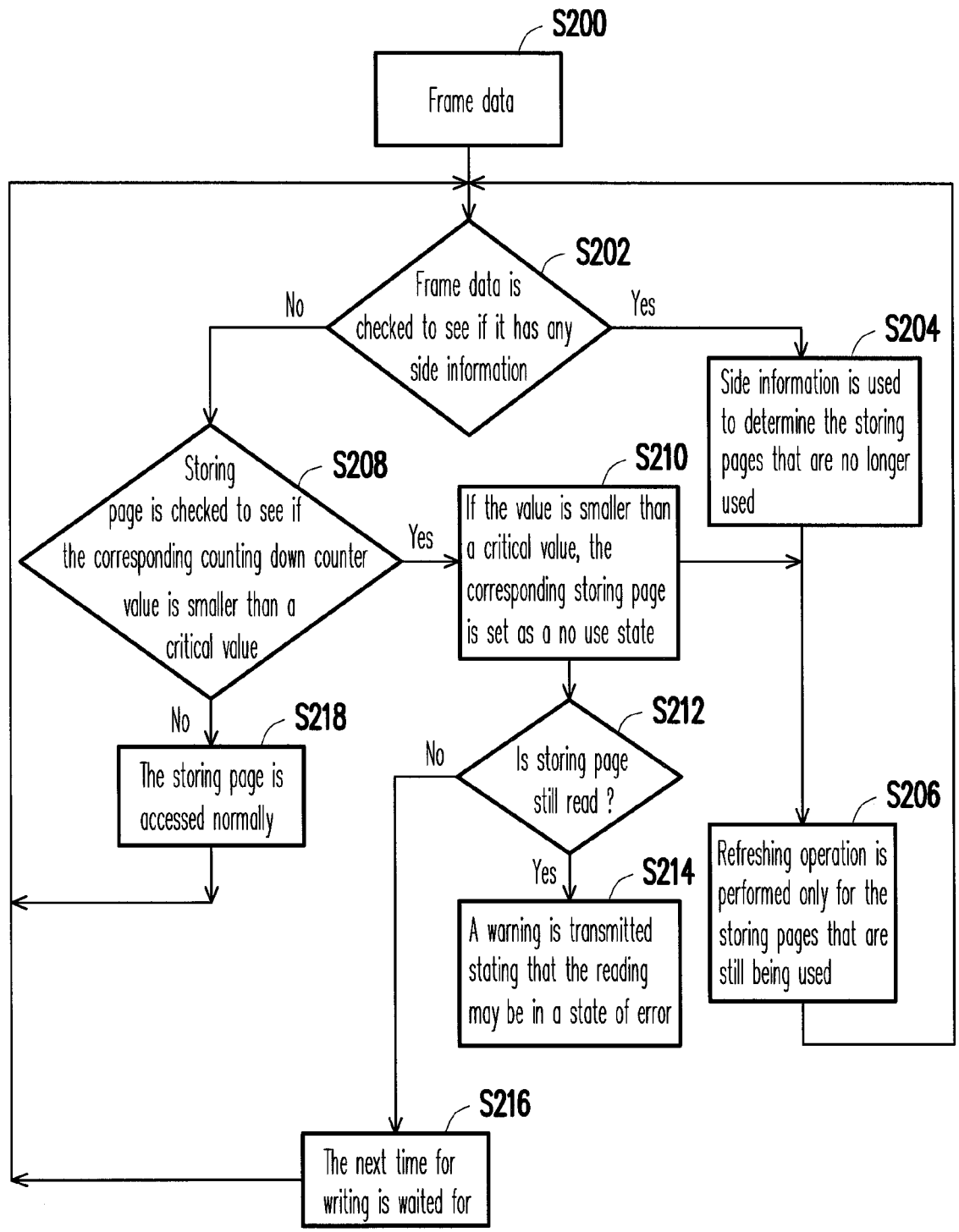
FIG. 9 is a flow diagram of a refresh method for DRAM according to an embodiment for the invention.

FIG. 9 is a flow diagram of a refresh method for DRAM according to an embodiment for the invention. Referring to FIG. 9, according to the descriptions above, the refresh method of DRAM can be represented by a flow diagram.

In step S200, the frame data is written into at least one storing page. In step S202, the frame data is checked to see if it has any side information. If it does, then the next step is S204. If it does not, then the next step is S208. In step S204, the side information of the frame data is used to determine the storing pages that are no longer used. Then in step S206, the refreshing operation is performed only for the storing pages that are still being used. In step S208, the storing page is checked to see if the corresponding counting down counter value is smaller than a critical value. The critical value can be a set value or 0. In step S210, if the value is smaller than a critical value, the corresponding storing page is set as a no use state. In step S212, the storing page that was set as a no use state is checked to see if it is still being read. In step S214, if it is still being read, a warning is transmitted stating that the reading may be in a state of error. In step S216, if it not still being read, then the next time for writing is waited for. In step S218, if step S208 determines the value is not smaller than a critical value, then the storing page is accessed normally. After that, the method returns to step S202 to continue monitoring the reading and writing of frames.

The actual operation flow is not limited to the method shown in FIG. 9. The operation is mainly according to assistance from the side information of the frame or only according to the actual reading frequency of the storing page to determine which storage pages are no being longer used. This saves the refreshing operation from being performed towards the storing pages that are no longer being used.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A refresh method for dynamic random access memory (DRAM), wherein a memory cell array is arranged to have multiple storing pages, and each storing page has a counter value, the method comprising:
    detecting a portion of the storing pages no longer being used, indicated as a "no-use portion", and another portion of the storing pages still being in use, indicated as an "in-use portion"; and
    performing a refresh operation only on the in-use portion of the storing pages,
    wherein detecting the no-use portion of the storing pages comprises:
        providing by a memory master about an ending time stored in a frame data and at least one of the storing pages, wherein the frame data is received by the memory master to be written into a memory cell array; and
        setting the at least one storing page used by the corresponding frame data as the no-use portion when the ending time is detected.

2. The refresh method for DRAM as claimed in claim 1, wherein when the counter value of any one of the in-use portion of the storing pages exceeds a critical value, the refreshing operation is performed.

3. The refresh method for DRAM as claimed in claim 1, wherein detecting the no-use portion of the storing pages comprises:
    monitoring the counter values to be counted down of the storing pages to see if the values are lower than a critical value, wherein when any one of the counter values smaller than the critical value, a corresponding one of the storing pages is set as the no-use portion.

4. The refresh method for DRAM as claimed in claim 3, wherein when there is a counted down counter value smaller than the critical value, and the corresponding storing pages are still read, an error warning is transmitted.

5. The refresh method for DRAM as claimed in claim 3, wherein when there is a counted down counter value smaller than the critical value the refreshing operation is still performed towards the corresponding storing pages according to need.

6. A refresh device for dynamic random access memory (DRAM), wherein a memory cell array is arranged to have multiple storing pages, and each storing page has a counting down counter value, the refresh device comprising:
    an access control unit;
    a memory controller, accessing a frame data through the access control unit, wherein the frame data is accessed in a portion of the storing pages;
    a refresh control unit, performing a refresh operation towards the storage pages according to a designated address; and
    a monitoring unit, detecting a portion of the storing pages no longer being used, indicated as a "no-use portion", and notifying the refresh control unit to only perform the refreshing operation towards another portion of the storing pages still being in use, indicated as an "in-use portion",
    wherein when a memory master stores the frame data, the memory master provides a side information including an ending time of the frame data and at least one of the used storing pages,
    wherein the monitoring unit receives the side information of the memory master, and when the ending time is detected, the at least one storing page used by the corresponding frame data is set as the no-use portion, to notify the refresh control unit to not perform the refreshing operation towards the no-use portion.

7. The refresh device for DRAM as claimed in claim 6, wherein when the counting down counter value of any one of the in-use portion of the storing pages is lower than a critical value, the refreshing operation is performed.

8. The refresh device for DRAM as claimed in claim 6, wherein the monitoring unit monitors the counted down counter values of the storing pages to see if the values are lower than a critical value, when there is a counted down counter value smaller than the critical value, the corresponding storing pages are set as the no-use portion.

9. The refresh device for DRAM as claimed in claim 8, wherein when there is a counted down counter value smaller than the critical value, and the corresponding storing pages are still read, an error warning is transmitted.

10. The refresh device for DRAM as claimed in claim 8, wherein when there is a counted down counter value smaller than the critical value the refreshing operation is still performed towards the corresponding storing pages according to need.

11. A refresh method for dynamic random access memory (DRAM), wherein a memory cell array is arranged to have multiple storing pages, and each storing page has a counter value, the method comprising:
  detecting a portion of the storing pages no longer being used, indicated as a "no-use portion", and another portion of the storing pages still being in use, indicated as an "in-use portion"; and
  performing a refresh operation only on the in-use portion of the storing pages,
  wherein detecting the no-use portion of the storing pages comprises:
    providing by a memory master about a side information of a frame data and at least one of the storing pages, wherein the frame data is received by the memory master to be written into a memory cell array; and
    determining whether or not the at least one storing page used by the frame data is set as the no-use portion according to the side information.

\* \* \* \* \*